(12) United States Patent
Lee

(10) Patent No.: US 12,633,946 B2
(45) Date of Patent: May 19, 2026

(54) ERROR CORRECTION CIRCUIT

(71) Applicant: SK hynix Inc., Icheon-si (KR)

(72) Inventor: Kyo Yun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 27 days.

(21) Appl. No.: 18/771,392

(22) Filed: Jul. 12, 2024

(65) Prior Publication Data

US 2025/0293710 A1 Sep. 18, 2025

(30) Foreign Application Priority Data

Mar. 18, 2024 (KR) ........................ 10-2024-0037465

(51) Int. Cl.
*H03M 13/15* (2006.01)
*G11C 29/52* (2006.01)
*H03M 13/11* (2006.01)

(52) U.S. Cl.
CPC ......... *H03M 13/1575* (2013.01); *G11C 29/52* (2013.01); *H03M 13/1174* (2013.01)

(58) Field of Classification Search
CPC .......... H03M 13/1575; H03M 13/1174; G11C 29/52
See application file for complete search history.

(56) References Cited

U.S. PATENT DOCUMENTS 6,510,537 B1 * 1/2003 Lee ..................... G06F 11/1008
714/763
12,095,478 B2 * 9/2024 Jeong ................. H03M 13/1177

2002/0199153 A1 * 12/2002 Fall ....................... H03M 13/00
714/781
2012/0173951 A1 * 7/2012 Kong ................ H03M 13/1515
714/755
2018/0367166 A1 12/2018 Gilda et al.

FOREIGN PATENT DOCUMENTS

KR 1020110020397 A 3/2011

OTHER PUBLICATIONS

J. Jeong, D. Shin, W. Shin and J. Park, "An Even/Odd Error Detection Based Low-Complexity Chase Decoding for Low-Latency RS Decoder Design," in IEEE Communications Letters, vol. 25, No. 5, pp. 1505-1509, May 2021 (Year: 2021).*

* cited by examiner

*Primary Examiner* — Cynthia Britt
(74) *Attorney, Agent, or Firm* — WILLIAM PARK AND ASSOCIATES LTD.

(57) ABSTRACT

An error correction circuit includes a syndrome generation circuit configured to generate a first odd syndrome, a first even syndrome, and a second syndrome based on data. The error correction circuit also includes a location information generation circuit configured to generate odd location information and even location information, based on the first odd syndrome, the first even syndrome, and the second syndrome. The error correction circuit further includes a correction data generation circuit configured to check and correct an error that is included in a first odd-numbered symbol included in the data and an error that is included in a first even-numbered symbol included in the data, based on the first odd syndrome, the first even syndrome, the odd location information, and the even location information.

27 Claims, 13 Drawing Sheets

$$S_1 = e_b T^{k+ic+id} + e_b T^{k+(i+1)c+id}, i \in \{0,1,2,\cdots,9\}$$

$$\Lambda_{odd} = T^{k+ic+id} = \frac{S_1}{S_{0a} + T^c \cdot S_{0b}}$$

$$\Lambda_{even} = T^{k+(i+1)c+id} = \frac{S_1}{T^d \cdot S_{0a} + S_{0b}}$$

$$S_1 = e_a T^{k+(i+1)c+id} + e_b T^{k+(i+1)c+(i+1)d}, \, i \in \{0,1,2, \cdots ,9\}$$

$$\Lambda_{even} = T^{k+(i+1)c+id} = \frac{S_1}{T^d \cdot S_{0a} + S_{0b}}$$

$$\Lambda_{odd} = T^{k+(i+1)c+(i+1)d} = \frac{S_1}{S_{0a} + T^c \cdot S_{0b}}$$

FIG.6

| index form | polynomial form | binary form | decimal form |
|---|---|---|---|
| 0 | 0 | 0000 | 0 |
| $\alpha^0 = \alpha^{15}$ | 1 | 0001 | 1 |
| $\alpha^1$ | $\alpha$ | 0010 | 2 |
| $\alpha^2$ | $\alpha^2$ | 0100 | 4 |
| $\alpha^3$ | $\alpha^3$ | 1000 | 8 |
| $\alpha^4$ | $\alpha + 1$ | 0011 | 3 |
| $\alpha^5$ | $\alpha^2 + \alpha$ | 0110 | 6 |
| $\alpha^6$ | $\alpha^3 + \alpha^2$ | 1100 | 12 |
| $\alpha^7$ | $\alpha^3 + \alpha + 1$ | 1011 | 11 |
| $\alpha^8$ | $\alpha^2 + 1$ | 0101 | 5 |
| $\alpha^9$ | $\alpha^3 + \alpha$ | 1010 | 10 |
| $\alpha^{10}$ | $\alpha^2 + \alpha + 1$ | 0111 | 7 |
| $\alpha^{11}$ | $\alpha^3 + \alpha^2 + \alpha$ | 1110 | 14 |
| $\alpha^{12}$ | $\alpha^3 + \alpha^2 + \alpha + 1$ | 1111 | 15 |
| $\alpha^{13}$ | $\alpha^3 + \alpha^2 + 1$ | 1101 | 13 |
| $\alpha^{14}$ | $\alpha^3 + 1$ | 1001 | 9 |

$$S_{0a} = [0\ 1\ 1\ 0] = \alpha^5$$

$$S_{0b} = [0\ 0\ 0\ 0] = 0$$

$$S_1 = [0\ 0\ 1\ 1] = \alpha^4$$

$$\Lambda_{odd} = \frac{S_1}{S_{0a} + \alpha^7 \cdot S_{0b}} = \frac{\alpha^4}{\alpha^5} = \frac{\alpha^{19}}{\alpha^5} = \alpha^{14}$$

$$\Lambda_{even} = \frac{S_1}{\alpha^7 \cdot S_{0a} + S_{0b}} = \frac{\alpha^4}{\alpha^7 \cdot \alpha^5} = \frac{\alpha^{19}}{\alpha^{12}} = \alpha^7$$

FIG.9

$$S_{0a} = [0 \ 1 \ 1 \ 0] = \alpha^5$$

$$S_{0b} = [1 \ 1 \ 1 \ 0] = \alpha^{11}$$

$$S_1 = [0 \ 0 \ 1 \ 1] + [0 \ 1 \ 0 \ 0] = [0 \ 1 \ 1 \ 1] = \alpha^{10}$$

$$\Lambda_{odd} = \frac{S_1}{S_{0a} + \alpha^7 \cdot S_{0b}} = \frac{\alpha^{10}}{\alpha^5 + \alpha^7 \cdot \alpha^{11}} = \frac{\alpha^{10}}{\alpha^5 + \alpha^3} = \frac{\alpha^{25}}{\alpha^{11}} = \alpha^{14}$$

$$\Lambda_{even} = \frac{S_1}{\alpha^7 \cdot S_{0a} + S_{0b}} = \frac{\alpha^{10}}{\alpha^7 \cdot \alpha^5 + \alpha^{11}} = \frac{\alpha^{10}}{\alpha^{12} + \alpha^{11}} = \alpha^{10}$$

$$S_{0a} = [0\ 0\ 0\ 0] = 0$$

$$S_{0b} = [1\ 1\ 1\ 0] = \alpha^{11}$$

$$S_1 = [0\ 1\ 0\ 0] = \alpha^2$$

$$\Lambda_{odd} = \frac{S_1}{S_{0a} + \alpha^7 \cdot S_{0b}} = \frac{\alpha^2}{\alpha^7 \cdot \alpha^{11}} = \frac{\alpha^{32}}{\alpha^{18}} = \alpha^{14}$$

$$\Lambda_{even} = \frac{S_1}{\alpha^7 \cdot S_{0a} + S_{0b}} = \frac{\alpha^2}{\alpha^{11}} = \frac{\alpha^{17}}{\alpha^{11}} = \alpha^6$$

FIG.11

$$S_{0a} = [0\ 1\ 0\ 1] = \alpha^8$$

$$S_{0b} = [1\ 1\ 1\ 0] = \alpha^{11}$$

$$S_1 = [1\ 0\ 0\ 0] = \alpha^3$$

$$\Lambda_{odd} = \frac{S_1}{S_{0a} + \alpha^7 \cdot S_{0b}} = \frac{\alpha^3}{\alpha^8 + \alpha^7 \cdot \alpha^{11}} = \frac{\alpha^3}{\alpha^8 + \alpha^3} = \frac{\alpha^{18}}{\alpha^{13}} = \alpha^5$$

$$\Lambda_{even} = \frac{S_1}{\alpha^7 \cdot S_{0a} + S_{0b}} = \frac{\alpha^3}{\alpha^7 \cdot \alpha^8 + \alpha^{11}} = \frac{\alpha^3}{1 + \alpha^{11}} = \frac{\alpha^{18}}{\alpha^{12}} = \alpha^6$$

ERROR CORRECTION CIRCUIT

CROSS-REFERENCE TO RELATED APPLICATION

The present application claims priority under 35 U.S.C. § 119(a) to Korean Patent Application No. 10-2024-0037465, filed in the Korean Intellectual Property Office on Mar. 18, 2024, the entire disclosure of which application is incorporated herein by reference.

BACKGROUND

The present disclosure relates to an error correction circuit.

To correct an error included in data, various block codes, such as a Hamming code, a BCH code, and a Reed-Solomon (RS) code, are used. The hamming code is frequently used in data transmission through a channel in a computer memory system because the hamming code is efficient in sensing and modifying a single bit error. The BCH code is widely used in various fields, such as with a communication system, a storage device, or a computer network, because the BCH code can modify a multi-error and a burst error. The RS code is widely used for an application that requires a high-level error correction, for example, in a satellite communication system or a wireless communication system because the RS code can achieve a high-level error correction function with a relatively small number of redundant bits.

SUMMARY

In an embodiment of the present disclosure, an error correction circuit may include a syndrome generation circuit configured to generate a first odd syndrome, a first even syndrome, and a second syndrome based on data. The error correction circuit may also include a location information generation circuit configured to generate odd location information and even location information, based on the first odd syndrome, the first even syndrome, and the second syndrome. The error correction circuit may further include a correction data generation circuit configured to check and correct an error that is included in a first odd-numbered symbol included in the data and an error that is included in a first even-numbered symbol included in the data, based on the first odd syndrome, the first even syndrome, the odd location information, and the even location information. In an embodiment, the first even-numbered symbol may be consecutive to the first odd-numbered symbol.

In an embodiment of the present disclosure, an error correction circuit may include a syndrome generation circuit configured to generate a first odd syndrome, a first even syndrome, and a second syndrome by using an error correction code that is implemented as an H-matrix. The error correction circuit may also include a location information generation circuit configured to generate odd location information and even location information, based on the first odd syndrome, the first even syndrome, and the second syndrome. The error correction circuit may further include a correction data generation circuit configured to generate correction data by correcting an error included in data, based on the first odd syndrome, the first even syndrome, the odd location information, and the even location information. In an embodiment, the correction data generation circuit is configured to correct, when it is determined that an error has occurred in a first odd-numbered symbol based on the first odd syndrome and an error has occurred in a first even-numbered symbol that is consecutive to the first odd-numbered symbol based on the first even syndrome, the error included in data of the first odd-numbered symbol and the error included in data of the first even-numbered symbol based on the first odd syndrome, the first even syndrome, and the odd location information.

In an embodiment of the present disclosure, an error correction circuit may include a syndrome generation circuit configured to generate a first odd syndrome, a first even syndrome, and a second syndrome by using an error correction code that is implemented as an H-matrix. The error correction circuit may also include a location information generation circuit configured to generate odd location information and even location information, based on the first odd syndrome, the first even syndrome, and the second syndrome. The error correction circuit may further include a correction data generation circuit configured to generate correction data by correcting an error included in data based on the first odd syndrome, the first even syndrome, the odd location information, and the even location information. In an embodiment, first, second, and third rows of the H-matrix may correspond to first, second, and third blocks, respectively. The first block may include unit matrices corresponding to odd-numbered symbols, respectively, and zero matrices corresponding to even-numbered symbols, respectively. The second block may include zero matrices corresponding to the odd-numbered symbols, respectively, and unit matrices corresponding to the even-numbered symbols, respectively. The third block may include sub-matrices each including each of odd-numbered elements corresponding to the odd-numbered symbols, respectively, as a representative element and sub-matrices each including each of even-numbered elements corresponding to the even-numbered symbols, respectively, as a representative element.

In an embodiment of the present disclosure, an error correction circuit may include a syndrome generation circuit configured to generate a first odd syndrome, a first even syndrome, and a second syndrome based on data. The error correction circuit may also include a location information generation circuit configured to generate odd location information and even location information, based on the first odd syndrome, the first even syndrome, and the second syndrome. The error correction circuit may further include a correction data generation circuit configured to correct an error when the error occurs in symbols corresponding to sub-matrices each including each of elements having a specific distance difference as a representative element on a left side of a central axis in an H-matrix based on the first odd syndrome, the first even syndrome, the odd location information, and the even location information and configured to correct an error when the error occurs in symbols corresponding to sub-matrices each including each of elements having a specific distance difference as a representative element on a right side of the central axis. In an embodiment, the sub-matrices included in the H-matrix may correspond to the symbols, respectively.

BRIEF DESCRIPTION OF THE DRAWINGS

FIGS. 3 and 4 illustrate equations for describing an error correction operation when an error is included in continuous symbols.

FIG. 6 illustrates a table for implementing elements that are included in an H-matrix according to an embodiment of the present disclosure.

FIGS. 8 to 11 illustrate tables and equations for describing an error correction operation using the H-matrix illustrated in FIG. 7.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa. Terms such as "first" and "second" are not intended to imply a number or order of components.

One component being "coupled" or "connected" to another component means that the components may be directly coupled or connected to each other or coupled or connected to each other through another component interposed therebetween. In contrast, one component being "directly coupled" or "directly connected" to another component means that the components are directly coupled or connected to each other without another component interposed therebetween.

Hereafter, the present disclosure is described in more detail through embodiments. The embodiments are only used to exemplify the present disclosure, and the scope of the present disclosure is not limited by the embodiments.

Figure 1:
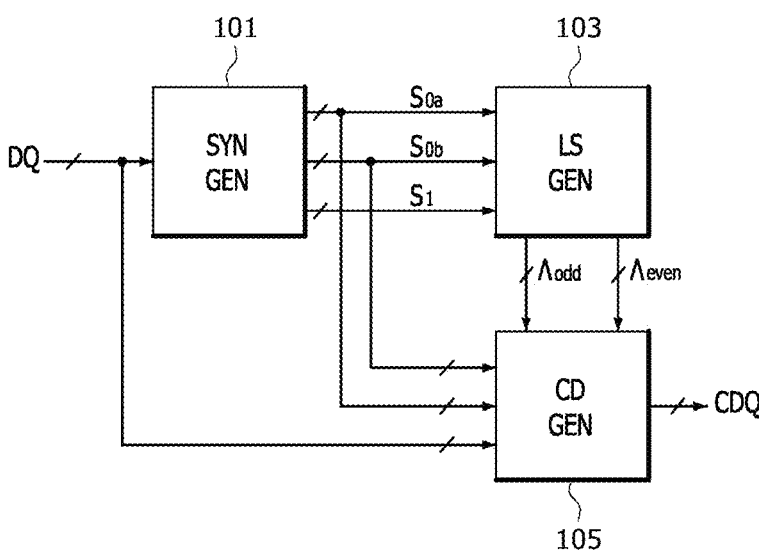
FIG. 1 illustrates a construction of an error correction circuit according to an embodiment of the present disclosure.

FIG. 1 illustrates a construction of an error correction circuit according to an embodiment of the present disclosure. As illustrated in FIG. 1, the error correction circuit 10 may include a syndrome generation circuit (SYN GEN) 101, a location information generation circuit (LS GEN) 103, and a correction data generation circuit (CD GEN) 105.

The syndrome generation circuit 101 may generate a first odd syndrome $S_{0a}$, a first even syndrome $S_{0b}$, and a second syndrome $S_1$, based on data DQ. The syndrome generation circuit 101 may generate the first odd syndrome $S_{0a}$, the first even syndrome $S_{0b}$, and the second syndrome $S_1$ by performing an operation on the data DQ based on an error correction code. The first odd syndrome $S_{0a}$ may indicate the location of data in which an error has occurred within an odd-numbered symbol when the error occurs in the odd-numbered symbol. The first even syndrome $S_{0b}$ may indicate the location of data in which an error has occurred within an even-numbered symbol when the error occurs in the even-numbered symbol. The second syndrome $S_1$ may indicate the location of a symbol in which an error has occurred. The error correction code may be implemented as an H-matrix.

The location information generation circuit 103 may be electrically connected to the syndrome generation circuit 101, and may receive the first odd syndrome $S_{0a}$, the first even syndrome $S_{0b}$, and the second syndrome $S_1$ from the syndrome generation circuit 101. The location information generation circuit 103 may generate odd location information $\Lambda_{odd}$ and even location information $\Lambda_{even}$ based on the first odd syndrome $S_{0a}$, the first even syndrome $S_{0b}$, and the second syndrome $S_1$. The odd location information $\Lambda$odd may indicate the location of an odd-numbered symbol in which an error has occurred. The even location information $\Lambda_{even}$ may indicate the location of an even-numbered symbol in which an error has occurred.

The correction data generation circuit 105 may be electrically connected to the syndrome generation circuit 101 and the location information generation circuit 103, may receive the first odd syndrome $S_{0a}$ and the first even syndrome $S_{0b}$ from the syndrome generation circuit 101, and may receive the odd location information $\Lambda_{odd}$ and the even location information $\Lambda_{even}$ from the location information generation circuit 103. The correction data generation circuit 105 may generate correction data CDQ by correcting an error included in the data DQ, based on the first odd syndrome $S_{0a}$, the first even syndrome $S_{0b}$, the odd location information $\Lambda_{odd}$, and the even location information $\Lambda_{even}$.

The correction data generation circuit 105 may generate the correction data CDQ by correcting an error included in the data DQ of an odd-numbered symbol based on the first odd syndrome $S_{0a}$ and the odd location information $\Lambda_{odd}$, when it is determined that an error has occurred in the odd-numbered symbol based on the first odd syndrome $S_{0a}$ and an error has not occurred in an even-numbered symbol based on the first even syndrome $S_{0b}$. The correction data generation circuit 105 may generate the correction data CDQ by correcting an error included in the data DQ of an even-numbered symbol based on the first even syndrome $S_{0b}$ and the even location information $\Lambda_{even}$, when it is determined that an error has occurred in the even-numbered symbol based on the first even syndrome $S_{0b}$ and an error has not occurred in an odd-numbered symbol based on the first odd syndrome $S_{0a}$. The correction data generation circuit 105 may generate the correction data CDQ by correcting an error included in the data DQ of an odd-numbered symbol based on the first odd syndrome $S_{0a}$, the first even syndrome $S_{0b}$, and the odd location information $\Lambda_{odd}$ and an error included in the data DQ of an even-numbered symbol consecutive to the odd-numbered symbol, when it is determined that the error has occurred in the odd-numbered symbol based on the first odd syndrome $S_{0a}$ and the error has occurred in the even-numbered symbol consecutive to the odd-numbered symbol based on the first even syndrome $S_{0b}$. The correction data generation circuit 105 may generate the correction data CDQ by correcting an error included in the data DQ of an even-numbered symbol based on the first odd syndrome $S_{0a}$, the first even syndrome $S_{0b}$, and the even location information $\Lambda_{even}$ and an error included in the data DQ of an odd-numbered symbol consecutive to the even-numbered symbol, when it is determined that the error has occurred in the even-numbered symbol based on the first even syndrome $S_{0b}$ and the error has occurred in the odd-numbered symbol consecutive to the even-numbered symbol based on the first odd syndrome $S_{0a}$. The correction data generation circuit 105 may discard the odd location information $\Lambda_{odd}$ when a symbol indicated by the odd location information $\Lambda_{odd}$ is an even-numbered symbol. The correction data generation circuit 105 may discard the even location information $\Lambda_{even}$ when a symbol indicated by the even location information $\Lambda_{even}$ is an odd-numbered symbol.

Figure 2:
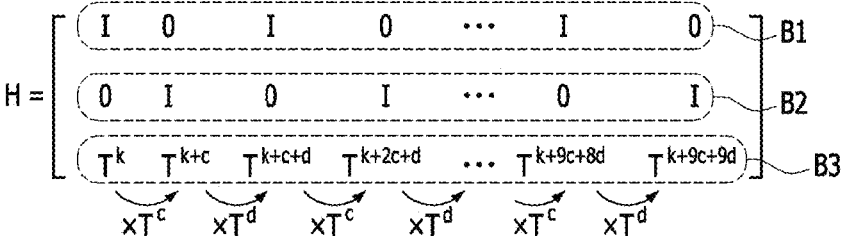
FIG. 2 illustrates an H-matrix according to an embodiment of the present disclosure.

FIG. 2 illustrates an H-matrix according to an embodiment of the present disclosure.

As illustrated in FIG. 2, the rows of the H-matrix may correspond to first to third blocks B1 to B3, respectively. A block refers to information being encoded in a sequence or block. The first block B1 corresponding to the first row of the H-matrix may include sub-matrices corresponding to symbols, respectively. The first block B1 may include unit matrices I corresponding to odd-numbered symbols, respectively, and zero matrices 0 corresponding to even-numbered symbols, respectively. In the unit matrix I, only a matrix element having the same row number and column number may be set to 1, and the remaining matrix elements may be set to 0. All of matrix elements included in the zero matrix 0 may be set to 0. The second block B2 may include zero matrices 0 corresponding to odd-numbered symbols, respectively, and unit matrices I corresponding to even-numbered symbols, respectively.

The third block B3 may include sub-matrices each having each of elements consisting of $T^k$, $T^{k+c}$, $T^{k+c+d}$, $T^{k+2c+d}$, . . . , $T^{k+9c+8d}$, and $T^{k+9c+9d}$ as a representative element. $T^k$ may indicate a sub-matrix in which the first column has an index form of the exponentiation of k as a representative element. In the sub-matrix indicated by $T^k$, the first column may have an index form of the exponentiation of k as a representative element. In the sub-matrix indicated by $T^k$, each of the columns subsequent to the second column may correspond to an index form of exponentiation in which +1 has been added to exponentiation in a previous column. The index form may denote elements that constitute the Galois field of a Reed-Solomon (RS) code. In the RS code, the H-matrix may be implemented by using the elements of the Galois field. This is described later with reference to FIGS. 6 and 7.

$T^{k+c}$ may indicate a sub-matrix in which the first column has an index form of the exponentiation of k+c as a representative element. In the sub-matrix indicated by $T^{k+c}$, the first column may have the index form of the exponentiation of k+c as a representative element. In the sub-matrix indicated by $T^{k+c}$, each of the columns subsequent to the second column may correspond to an index form of exponentiation in which +1 has been added to exponentiation in a previous column.

$T^{k+c+d}$ may indicate a sub-matrix in which the first column has an index form of exponentiation of k+c+d as a representative element. In the sub-matrix indicated by $T^{k+c+d}$, the first column may have the index form of the exponentiation of k+c+d as a representative element. In the sub-matrix indicated by $T^{k+c+d}$, each of the columns subsequent to the second column may correspond to an index form of exponentiation in which +1 has been added to exponentiation in a previous column.

$T^{k+2c+d}$ may indicate a sub-matrix in which the first column has an index form of exponentiation of k+2c+d as a representative element. In the sub-matrix indicated by $T^{k+2c+d}$, the first column may have the index form of the exponentiation of k+2c+d as a representative element. In the sub-matrix indicated by $T^{k+2c+d}$, each of the columns subsequent to the second column may correspond to an index form of exponentiation in which +1 has been added to exponentiation in a previous column.

$T^{k+9c+8d}$ may indicate a sub-matrix in which the first column has an index form of exponentiation of k+9c+8d as a representative element. In the sub-matrix indicated by $T^{k+9c+8d}$, the first column may have the index form of the exponentiation of k+9c+8d as a representative element. In the sub-matrix indicated by $T^{k+9c+8d}$, each of the columns subsequent to the second column may correspond to an index form of exponentiation in which +1 has been added to exponentiation in a previous column.

$T^{k+9c+9d}$ may indicate a sub-matrix in which the first column has an index form of exponentiation of k+9c+9d as a representative element. In the sub-matrix indicated by $T^{k+9c+9d}$, the first column may have the index form of the exponentiation of k+9c+9d as a representative element. In the sub-matrix indicated by $T^{k+9c+9d}$, each of the columns subsequent to the second column may correspond to an index form of exponentiation in which +1 has been added to exponentiation in a previous column.

The even-numbered elements included in the third block B3 may be set to have a distance difference of "c" from a previous odd-numbered element. Each of odd-numbered elements after the third block may be set to have a distance difference of "d" from a previous even-numbered element. The distance difference of "c" may indicate that an element having an index form of exponentiation of "c" is multiplied. The distance difference of "d" may indicate that an element having an index form of exponentiation of "d" is multiplied.

FIGS. 3 and 4 illustrate equations for describing an error correction operation when an error is included in continuous symbols.

As illustrated in FIG. 3, when an error is included in an odd-numbered symbol $T^{k+ic+id}$ and a continuous even-numbered symbol $T^{k+(i+1)c+id}$, the first odd syndrome $S_{0a}$ may be set as a first error signal ea indicative of the location of data in which the error has occurred in the odd-numbered symbol in which the error has occurred, and the first even syndrome $S_{0b}$ may be set as a second error signal $e_b$ indicative of the location of data in which the error has occurred in the even-numbered symbol in which the error has occurred. In this case, i may be set as an integer between 0 and 9. In this case, the odd location information $\Lambda_{odd}$ may be set as $$T^{k+ic+id} = \frac{S_1}{S_{0a} + T^c S_{0b}},$$

and the even location information $\Lambda_{even}$ may be set as $$T^{k+(i+1)c+id} = \frac{S_1}{T^d S_{0a} + S_{0b}}.$$

As illustrated in FIG. 4, when an error is included in an even-numbered symbol $T^{k+(i+1)c+id}$, and a continuous odd-numbered symbol $T^{k+(i+1)c+(i+1)d}$, the first odd syndrome $S_{0a}$ may be set as a first error signal ea indicative of the location of data in which the error has occurred in the odd-numbered symbol in which the error has occurred, and the first even syndrome $S_{0b}$ may be set as a second error signal $e_b$ indicative of the location of data in which the error has occurred in the even-numbered symbol in which the error has occurred. In this case, the even location information $\Lambda_{even}$ may be set as $$T^{k+(i+1)c+id} = \frac{S_1}{T^d S_{0a} + S_{0b}},$$

and the odd location information $\Lambda_{odd}$ may be set as $$T^{k+(i+1)c+(i+1)d} = \frac{S_1}{S_{0a} + T^c S_{0b}}.$$

Figure 5:
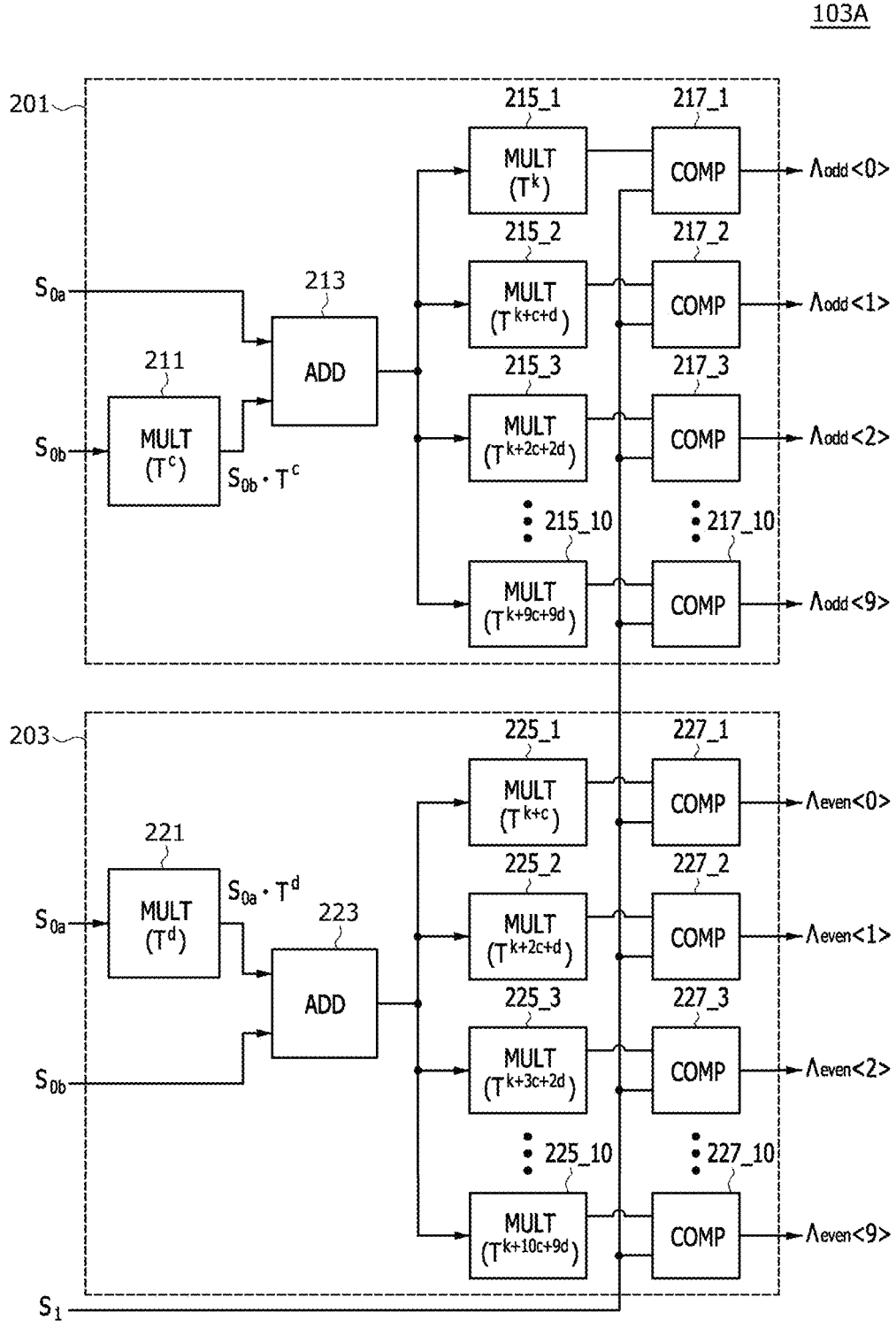
FIG. 5 illustrates a construction of a location information generation circuit according to an embodiment of the present disclosure.

FIG. 5 illustrates a construction of a location information generation circuit 103A according to an embodiment of the location information generation circuit 103. As illustrated in FIG. 5, the location information generation circuit 103A may include a first location information generation circuit 201 and a second location information generation circuit 203.

The first location information generation circuit 201 may include multipliers (MULT) 211 and 215_1 to 215_10, an adder (ADD) 213, and comparators (COMP) 217_1 to 217_10. The multiplier 211 may output an output signal by multiplying a first even syndrome $S_{0b}$ by a representative element of a sub-matrix indicated by $T^c$. The equation of the output signal of the multiplier 211 may be $S_{0b}T^c$. The adder 213 may output an output signal by adding a first odd syndrome $S_{0a}$ and the output signal of the multiplier 211. The equation of the output signal of the adder 213 may be $S_{0a}+S_{0b}T^c$.

The multiplier 215_1 outputs an output signal by multiplying the output signal of the adder 213 by a representative element of a sub-matrix indicated by $T^k$. The equation of the output signal of the multiplier 215_1 may be $(S_{0a}+S_{0b}T^c)T^k$. The comparator 217_1 may generate a first bit $\Lambda_{odd}<0>$ of odd location information $\Lambda_{odd}$ by comparing the output signal of the multiplier 215_1 and a second syndrome $S_1$. The comparator 217_1 may generate the first bit $\Lambda_{odd}<0>$ of the odd location information $\Lambda_{odd}$ that is activated when when the output signal of the multiplier 215_1 and the second syndrome $S_1$ are identical with each other. The first bit $\Lambda_{odd}<0>$ of the odd location information $\Lambda_{odd}$ may be activated to indicate that an error has been included in a sub-matrix corresponding to a specific symbol including the representative element of the sub-matrix indicated by $T^k$.

The multiplier 215_2 may output an output signal by multiplying the output signal of the adder 213 by a representative element of a sub-matrix indicated by $T^{k+c+d}$. The equation of the output signal of the multiplier 215_2 may be $(S_{0a}+S_{0b}T^c)T^{k+c+d}$. The comparator 217_2 may generate a second bit $\Lambda_{odd}<1>$ of the odd location information $\Lambda_{odd}$ by comparing the output signal of the multiplier 215_2 and the second syndrome $S_1$. The comparator 217_2 may generate the second bit $\Lambda_{odd}<1>$ of the odd location information $\Lambda_{odd}$ that is activated when the output signal of the multiplier 215_2 and the second syndrome $S_1$ are identical with each other. The second bit $\Lambda_{odd}<1>$ of the odd location information $\Lambda_{odd}$ may be activated to indicate that an error has been included in a sub-matrix corresponding to a specific symbol including the representative element of the sub-matrix indicated by $T^{k+c+d}$.

The multiplier 215_3 may output an output signal by multiplying the output signal of the adder 213 by a representative element of a sub-matrix indicated by $T^{k+2c+2d}$. The equation of the output signal of the multiplier 215_3 may be $(S_{0a}+S_{0b}T^c)T^{k+2c+2d}$. The comparator 217_3 may generate a third bit $\Lambda_{odd}<2>$ of the odd location information $\Lambda_{odd}$ by comparing the output signal of the multiplier 215_3 and the second syndrome $S_1$. The comparator 217_3 may generate the third bit $\Lambda_{odd}<2>$ of the odd location information $\Lambda_{odd}$ that is activated when the output signal of the multiplier 215_3 and the second syndrome $S_1$ are identical with each other. The third bit $\Lambda_{odd}<2>$ of the odd location information $\Lambda_{odd}$ may be activated to indicate that an error has been included in a sub-matrix corresponding to a specific symbol including the representative element of the sub-matrix indicated by $T^{k+2c+2d}$.

The multiplier 215_10 may output an output signal by multiplying the output signal of the adder 213 by a representative element of a sub-matrix indicated by $T^{k+9c+9d}$. The equation of the output signal of the multiplier 215_10 may be $(S_{0a}+S_{0b}T^c)T^{k+9c+9d}$. The comparator 217_10 may generate a tenth bit $\Lambda_{odd}<9>$ of the odd location information $\Lambda_{odd}$ by comparing the output signal of the multiplier 215_10 and the second syndrome $S_1$. The comparator 217_10 may generate the tenth bit $\Lambda_{odd}<9>$ of the odd location information $\Lambda_{odd}$ that is activated when the output signal of the multiplier 215_10 and the second syndrome $S_1$ are identical with each other. The tenth bit $\Lambda_{odd}<9>$ of the odd location information $\Lambda_{odd}$ may be activated to indicate that an error has been included in a sub-matrix corresponding to a specific symbol including the representative element of the sub-matrix indicated by $T^{k+9c+9d}$.

The second location information generation circuit 203 may include multipliers (MULT) 221 and 225_1 to 225_10, an adder (ADD) 223, and comparators (COMP) 227_1 to 227_10. The multiplier 221 may output an output signal by multiplying the first odd syndrome $S_{0a}$ by a representative element of a sub-matrix indicated by $T^d$. The equation of the output signal of the multiplier 221 may be $S_{0a}T^d$. The adder 223 may output an output signal by adding the first even syndrome $S_{0b}$ and the output signal of the multiplier 221. The equation of the output signal of the adder 223 may be $S_{0b}+S_{0a}T^d$.

The multiplier 225_1 may output an output signal by multiplying the output signal of the adder 223 by a representative element of a sub-matrix indicated by $T^{k+c}$. The equation of the output signal of the multiplier 225_1 may be $(S_{0b}+S_{0a}T^d)T^{k+c}$. The comparator 227_1 may generate a first bit $\Lambda_{even}<0>$ of even location information $\Lambda_{even}$ by comparing the output signal of the multiplier 225_1 and the second syndrome $S_1$. The comparator 227_1 may generate the first bit $\Lambda_{even}<0>$ of the even location information $\Lambda_{even}$ that is activated when the output signal of the multiplier 225_1 and the second syndrome $S_1$ are identical with each other. The first bit $\Lambda_{even}<0>$ of the even location information $\Lambda_{even}$ may be activated to indicate that an error has been included in a sub-matrix corresponding to a specific symbol including the representative element of the sub-matrix indicated by $T^{k+c}$.

The multiplier 225_2 may output an output signal by multiplying the output signal of the adder 223 by a representative element of a sub-matrix indicated by $T^{k+2c+d}$. The equation of the output signal of the multiplier 225_2 may be $(S_{0b}+S_{0a}T^d)T^{k+2c+d}$. The comparator 227_2 may generate a second bit $\Lambda_{even}<1>$ of the even location information $\Lambda_{even}$ by comparing the output signal of the multiplier 225_2 and the second syndrome $S_1$. The comparator 227_2 may generate the second bit $\Lambda_{even}<1>$ of the even location information $\Lambda_{even}$ that is activated when the output signal of the multiplier 225_2 and the second syndrome $S_1$ are identical with each other. The second bit $\Lambda_{even}<1>$ of the even location information $\Lambda_{even}$ may be activated to indicate that an error has been included in a sub-matrix corresponding to a specific symbol including the representative element of the sub-matrix indicated by $T^{k+2c+d}$.

The multiplier 225_3 may output an output signal by multiplying the output signal of the adder 223 by a representative element of a sub-matrix indicated by $T^{k+3c+2d}$. The equation of the output signal of the multiplier 225_3 may be indicated by $(S_{0b}+S_{0a}T^d)T^{k+3c+2d}$. The comparator 227_3 may generate a third bit $\Lambda_{even}<2>$ of the even location information $\Lambda_{even}$ by comparing the output signal of the multiplier 225_3 and the second syndrome $S_1$. The comparator 227_3 may generate the third bit $\Lambda_{even}<2>$ of the even location information $\Lambda_{even}$ that is activated when the output signal of the multiplier 225_3 and the second syndrome $S_1$ are identical with each other. The third bit $\Lambda_{even}<2>$ of the even location information $\Lambda_{even}$ may be activated to indicate that an error has been included in a sub-matrix corresponding to a specific symbol including the representative element of the sub-matrix indicated by $T^{k+3c+2d}$.

The multiplier 225_10 may output an output signal by multiplying the output signal of the adder 223 by a representative element of a sub-matrix indicated by $T^{k+10c+9d}$. The equation of the output signal of the multiplier 225_10 may be $(S_{0b}+S_{0a}T^d)T^{k+10c+9d}$. The comparator 227_10 may generate a tenth bit $\Lambda_{even}<9>$ of the even location information $\Lambda_{even}$ by comparing the output signal of the multiplier 225_10 and the second syndrome $S_1$. The comparator 227_10 may generate the tenth bit $\Lambda_{even}<9>$ of the even location information $\Lambda_{even}$ that is activated when the output signal of the multiplier 225_10 and the second syndrome $S_1$ are identical with each other. The tenth bit $\Lambda_{even}<9>$ of the even location information $\Lambda_{even}$ may be activated to indicate that an error has been included in a sub-matrix corresponding to a specific symbol including the representative element of the sub-matrix indicated by $T^{k+10c+9d}$.

FIG. 6 illustrates a table for implementing elements that are included in an H-matrix according to an embodiment of the present disclosure.

As illustrated in FIG. 6, the elements included in the H-matrix may be implemented as the Galois field of the RS code. When the elements included in the H-matrix are set as m bits, the elements included in the H-matrix may be set to $(2^m-1)$ in number. For example, when the elements included in the H-matrix are set to 4 bits, the H-matrix may include elements having 15 index forms from "$a^0$" to "$a^{14}$". The elements included in the H-matrix may be represented in a polynomial form by using a polynomial expression $p(x)=x^4+x+1$. That is, each of the elements having the 15 index forms from "$a^0$" to "$a^{14}$", which are included in the H-matrix, may be converted into a polynomial form, a binary form, and a decimal form by using $p(a)=0$, $a^4+a+1=0$.

The element having the index form of "$a^0$" may be converted into a polynomial form "1" and may be converted into a binary form "0001" and a decimal form "1". The element having the index form of "$a^1$" may be converted into a polynomial form "a" and may be converted into a binary form "0010" and a decimal form "2". The element having the index form of "$a^2$" may be converted into a polynomial form "$a^2$" and may be converted into a binary form "0100" and a decimal form "4". The element having the index form of "$a^3$" may be converted into a polynomial form "$a^3$" and may be converted into a binary form "1000" and a decimal form "8". The element having the index form of "$a^4$" may be converted into a polynomial form "+1" and may be converted into a binary form "0011" and a decimal form "3". This is the results of deriving $a^4=a+1$ from $a^4+a+1=0$ because an addition operation in the Galois field is an exclusive OR operation. The element having the index form of "$a^5$" may be converted into a polynomial form "$a^2+a$" and may be converted into a binary form "0110" and a decimal form "6". The element having the index form of "$a^6$" may be converted into a polynomial form "$a^3+a^2$" and may be converted into a binary form "1100" and a decimal form "12". The element having the index form of "$a^7$" may be converted into a polynomial form "$a^3+a+1$" and may be converted into a binary form "1011" and a decimal form "11". The element having the index form of "$a^8$" may be converted into a polynomial form "$a^2+1$" and may be converted into a binary form "0101" and a decimal form "5". The element having the index form of "$a^9$" may be converted into a polynomial form "$a^3+a$" and may be converted into a binary form "1010" and a decimal form "10". The element having the index form of "$a^{10}$" may be converted into a polynomial form "$a^2+a+1$" and may be converted into a binary form "0111" and a decimal form "7". The element having the index form of "$a^{11}$" may be converted into a polynomial form "$a^3+a^2+a$" and may be converted into a binary form "1110" and a decimal form "14". The element having the index form of "$a^{12}$" may be converted into a polynomial form "$a^3+a^2+a+1$" and may be converted into a binary form "1111" and a decimal form "15". The element having the index form of "$a^{13}$" may be converted into a polynomial form "$a^3+a^2+1$" and may be converted into a binary form "1101" and a decimal form "13". The element having the index form of "$a^{14}$" may be converted into a polynomial form "$a^3+1$" and may be converted into a binary form "1001" and a decimal form "9".

Figure 7:
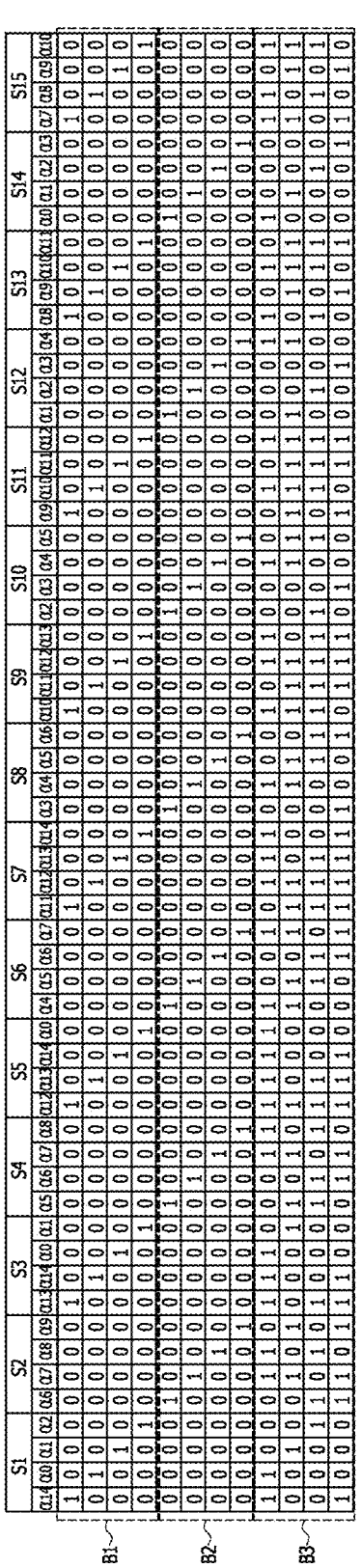
FIG. 7 illustrates an H-matrix according to an embodiment of the present disclosure.

FIG. 7 illustrates an H-matrix according to an embodiment of the present disclosure.

The H-matrix illustrated in FIG. 7 may be implemented by using elements set to 4 bits as the Galois field of the RS code. The H-matrix may include a first block B1, a second block B2, and a third block B3.

Each of odd-numbered symbols S1, S3, S5, S7, S9, S11, S13, and S15 of the first block B1 may be implemented as a sub-matrix that is implemented to have a unit matrix having a 4×4 size. Each of even-numbered symbols S2, S4, S6, S8, S10, S12, and S14 of the first block B1 may be implemented as a sub-matrix that is implemented to have a zero matrix having a 4×4 size. The matrix having the 4×4 size may indicate a matrix that has been implemented to have four rows and four columns.

Each of odd-numbered symbols S1, S3, S5, S7, S9, S11, S13, and S15 of the second block B2 may be implemented as a sub-matrix that is implemented to have a zero matrix having a 4×4 size. Each of even-numbered symbols S2, S4, S6, S8, S10, S12, and S14 of the second block B2 may be implemented as a sub-matrix that is implemented to have a unit matrix having a 4×4 size.

The third block B3 may be implemented assuming a case in which k=14, c=7, and d=7 in the H-matrix illustrated in FIG. 2. The first symbol S1 of the third block B3 may include sub-matrices that include elements consisting of $T^{14}$ as a representative element.

The first symbol S1 may include the first column having an index form of "$a^{14}$" and a binary form of "1001", the second column having an index form of "$a^0$" and a binary form of "0001", the third column having an index form of "$a^1$" and a binary form of "0010", and the fourth column having an index form of "$a^2$" and a binary form of "0100".

The second symbol S2 of the third block B3 may include the first column having an index form of "$a^6$" and a binary form of "1100", the second column having an index form of "$a^7$" and a binary form of "1011", the third column having an index form of "$a^8$" and a binary form of "0101", and the fourth column having an index form of "$a^9$" and a binary form of "1010".

The third symbol S3 of the third block B3 may include the first column having an index form of "$a^{13}$" and a binary form of "1101", the second column having an index form of "$a^{14}$"

and a binary form of "1001", the third column having an index form of "$a^0$" and a binary form of "0001", and the fourth column having an index form of "$a^1$" and a binary form of "0010".

The fourth symbol S4 of the third block B3 may include the first column having an index form of "$a^5$" and a binary form of "0110", the second column having an index form of "$a^6$" and a binary form of "1100", the third column having an index form of "$a^7$" and a binary form of "1011", and the fourth column having an index form of "$a^8$" and a binary form of "0101".

The fifth symbol S5 of the third block B3 may include the first column having an index form of "$a^{12}$" and a binary form of "1111", the second column having an index form of "$a^{13}$" and a binary form of "1101", the third column having an index form of "$a^{14}$" and a binary form of "1001", and the fourth column having an index form of "$a^0$" and a binary form of "0001".

The sixth symbol S6 of the third block B3 may include the first column having an index form of "$a^4$" and a binary form of "0011", the second column having an index form of "$a^5$" and a binary form of "0110", the third column having an index form of "$a^6$" and a binary form of "1100", and the fourth column having an index form of "$a^7$" and a binary form of "1011".

The seventh symbol S7 of the third block B3 may include the first column having an index form of "$a^{11}$" and a binary form of "1110", the second column having an index form of "$a^{12}$" and a binary form of "1111", the third column having an index form of "$a^{13}$" and a binary form of "1101", and the fourth column having an index form of "$a^{14}$" and a binary form of "1001".

The eighth symbol S8 of the third block B3 may include the first column having an index form of "$a^3$" and a binary form of "1000", the second column having an index form of "$a^4$" and a binary form of "0011", the third column having an index form of "$a^5$" and a binary form of "0110", and the fourth column having an index form of "$a^6$" and a binary form of "1100".

The ninth symbol S9 of the third block B3 may include the first column having an index form of "$a^{10}$" and a binary form of "0111", the second column having an index form of "$a^{11}$" and a binary form of "1110", the third column having an index form of "$a^{12}$" and a binary form of "1111", and the fourth column having an index form of "$a^{13}$" and a binary form of "1101".

The tenth symbol S10 of the third block B3 may include the first column having an index form of "$a^2$" and a binary form of "0100", the second column having an index form of "$a^3$" and a binary form of "1000", the third column having an index form of "$a^4$" and a binary form of "0011", and the fourth column having an index form of "$a^5$" and a binary form of "0110".

The eleventh symbol S11 of the third block B3 may include the first column having an index form of "$a^9$" and a binary form of "1010", the second column having an index form of "$a^{10}$" and a binary form of "0111", the third column having an index form of "$a^{11}$" and a binary form of "1110", and the fourth column having an index form of "$a^{12}$" and a binary form of "1111".

The twelfth symbol S12 of the third block B3 may include the first column having an index form of "$a^1$" and a binary form of "0010", the second column having an index form of "$a^2$" and a binary form of "0100", the third column having an index form of "$a^3$" and a binary form of "1000", and the fourth column having an index form of "$a^4$" and a binary form of "0011".

The thirteenth symbol S13 of the third block B3 may include the first column having an index form of "$a^8$" and a binary form of "0101", the second column having an index form of "$a^9$" and a binary form of "1010", the third column having an index form of "$a^{10}$" and a binary form of "0111", and the fourth column having an index form of "$a^{11}$" and a binary form of "1110".

The fourteenth symbol S14 of the third block B3 may include the first column having an index form of "$a^0$" and a binary form of "0001", the second column having an index form of "$a^1$" and a binary form of "0010", the third column having an index form of "$a^2$" and a binary form of "0100", and the fourth column having an index form of "$a^3$" and a binary form of "1000".

The fifteenth symbol S15 of the third block B3 may include the first column having an index form of "$a^7$" and a binary form of "1011", the second column having an index form of "$a^8$" and a binary form of "0101", the third column having an index form of "$a^9$" and a binary form of "1010", and the fourth column having an index form of "$a^{10}$" and a binary form of "0111".

FIGS. 8 to 11 illustrate tables and equations for describing an error correction operation using the H-matrix illustrated in FIG. 7.

Figure 8:

As illustrated in FIG. 8, when an error is included in the second data and third data of the first symbol S1, the first odd syndrome $S_{0a}$ may be generated in the binary form of "0110" as a result of an exclusive OR operation for the second and third columns of the first symbol S1 of the first block B1. The first even syndrome $S_{0b}$ may be generated in the binary form of "0000" because an error has not been included in the even-numbered symbols S2, S4, S6, S8, S10, S12, and S14. The second syndrome $S_1$ may be generated in the binary form of "0011" as a result of an exclusive OR operation for the second column and third column of the first symbol S1 of the third block B3. The first odd syndrome $S_{0a}$ may be generated in the index form of "$a^5$", and the second syndrome $S_1$ may be generated in the index form of "$a^4$". Accordingly, the odd location information $\Lambda_{odd}$ may be generated in the index form of "$a^{14}$", and the even location information $\Lambda_{even}$ may be generated in the index form of "$a^7$". The even location information $\Lambda_{even}$ may be discarded and an error of data may be corrected based on the odd location information $\Lambda_{odd}$, because "$a^{14}$" corresponds to the index form of the representative element of the first symbol S1 and "$a^7$" corresponds to the index form of the representative element of the fifteenth symbol S15. That is, the error may be corrected because it is determined that the error has been included in the second data and third data of the first symbol S1 based on the odd location information $\Lambda_{odd}$ and the first odd syndrome $S_{0a}$.

As illustrated in FIG. 9, when an error is included in the second data and third data of the first symbol S1 and the second data to fourth data of the second symbol S2, the first odd syndrome $S_{0a}$ may be generated in the binary form of "0110" as a result of an exclusive OR operation for the second and third columns of the first symbol S1 of the first block B1. The first even syndrome $S_{0b}$ may be generated in the binary form of "1110" as a result of an exclusive OR operation for the second column to fourth column of the second symbol S2 of the second block B2. The second syndrome $S_1$ may be generated in the binary form of "0111" as a result of an exclusive OR operation for the second column and third column of the first symbol S1 of the third block B3 and the second column to fourth column of the second symbol S2 of the third block B3. The first odd syndrome $S_{0a}$ may be generated in the index form of "$a^5$".

The first even syndrome $S_{0b}$ may be generated in the index form of "$a^{11}$". The second syndrome $S_1$ may be generated in the index form of "$a^{10}$". Accordingly, the odd location information $\Lambda_{odd}$ may be generated in the index form of "$a^{14}$", and the even location information $\Lambda_{even}$ may be generated in the index form of "$a^{10}$". The even location information $\Lambda_{even}$ may be discarded and an error of data may be corrected based on the odd location information $\Lambda_{odd}$ because "$a^{14}$" corresponds to the index form of the representative element of the first symbol S1 and "$a^{10}$" corresponds to the index form of the representative element of the ninth symbol S9. That is, the error may be corrected because it is determined that an error has been included in the second data and third data of the first symbol S1 based on the odd location information $\Lambda_{odd}$ and the first odd syndrome $S_{0a}$ and an error has been included in the second data to fourth data of the second symbol S2 based on the odd location information $\Lambda_{odd}$ and the first even syndrome $S_{0b}$.

Figure 10:
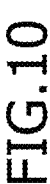

As illustrated in FIG. 10, when an error is included in the second data to fourth data of the second symbol S2, the first odd syndrome $S_{0a}$ may be generated in the binary form of "0000" because an error has not been included in the odd-numbered symbols S1, S3, S5, S7, S9, S11, S13, and S15. The first even syndrome $S_{0b}$ may be generated in the binary form of "1110" as a result of an exclusive OR operation for the second column to fourth column of the second symbol S2 of the second block B2. The second syndrome $S_1$ may be generated in the binary form of "0100" as a result of an exclusive OR operation for the second column to fourth column of the second symbol S2 of the third block B3. The odd location information $\Lambda_{odd}$ may be generated in the index form of "$a^{14}$" and the even location information $\Lambda_{even}$ may be generated in the index form of "$a^6$" because the first even syndrome $S_{0b}$ is generated in the index form of "$a^{11}$" and the second syndrome $S_1$ is generated in the index form of "$a^2$". The odd location information $\Lambda_{odd}$ may be discarded and the error of the data may be corrected based on the even location information $\Lambda_{even}$ because the first odd syndrome $S_{0a}$ is generated in the binary form of "0000". That is, the error may be corrected because it is determined that the error has been included in the second data to fourth data of the second symbol S2 based on the even location information $\Lambda_{even}$ and the first even syndrome $S_{0b}$.

As illustrated in FIG. 11, when an error is included in the second data to fourth data of the second symbol S2 and the first data and third data of the third symbol S3, the first odd syndrome $S_{0a}$ may be generated in the binary form of "0101" as a result of an exclusive OR operation for the first column and third column of the third symbol S3 of the first block B1. The first even syndrome $S_{0b}$ may be generated in the binary form of "1110" as a result of an exclusive OR operation for the second column to fourth column of the second symbol S2 of the second block B2. The second syndrome $S_1$ may be generated in the binary form of "1000" as a result of an exclusive OR operation for the second column to fourth column of the second symbol S2 and first column and third column of the third symbol S3 of the third block B3. The odd location information $\Lambda_{odd}$ may be generated in the index form of "$a^5$" and the even location information $\Lambda_{even}$ may be generated in the index form of "$a^6$" because the first odd syndrome $S_{0a}$ is generated in the index form of "$a^8$", the first even syndrome $S_{0b}$ is generated in the index form of "$a^{11}$", and the second syndrome $S_1$ is generated in the index form of "$a^3$". The odd location information $\Lambda_{odd}$ may be discarded and the error of the data may be corrected based on the even location information $\Lambda_{even}$ because "$a^5$" corresponds to the index form of the representative element of the fourth symbol S4 and "$a^6$" corresponds to the index form of the representative element of the second symbol S2. That is, the error may be corrected because it is determined that the error has been included in the second data to fourth data of the second symbol S2 based on the even location information $\Lambda_{even}$ and the first even syndrome $S_{0b}$ and the error has been included in the first data and third data of the third symbol S3 based on the even location information $\Lambda_{even}$ and the first odd syndrome $S_{0a}$.

As described above, the error correction circuit 10 according to an embodiment of the present disclosure can provide the RS code having an improved error correction capability because when the H-matrix including the first to third blocks B1 to B3 is constructed, the first block B1 is constructed to indicate a location at which an error has occurred in the odd-numbered symbols, the second block B2 is constructed to indicate a location at which an error has occurred in the even-numbered symbols, and the third block B3 is implemented to indicate the location of a symbol in which an error has occurred so that an error of data included in continuous symbols can be accurately detected and corrected.

Figure 12:
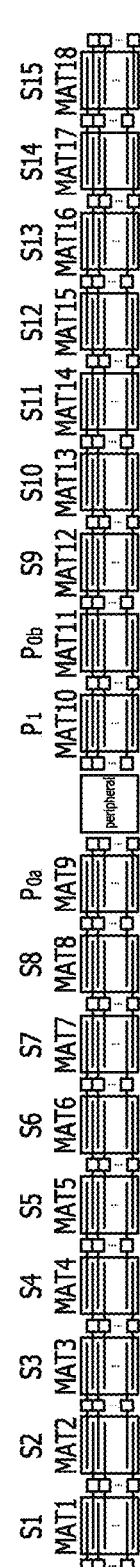
FIG. 12 illustrates a construction of a memory device according to an embodiment of the present disclosure.

FIG. 12 illustrates a construction of mats included in a memory device 20 according to an embodiment of the present disclosure.

As illustrated in FIG. 12, in the memory device 20, first to ninth mats MAT1 to MAT9 may be disposed on the left side of a peripheral circuit, and tenth to eighteenth mats MAT10 to MAT18 may be disposed on the right side of the peripheral circuit. When an H-matrix is constructed, the data of the first mat MAT1 may correspond to a first symbol S1, the data of the second mat MAT2 may correspond to a second symbol S2, the data of the third mat MAT3 may correspond to a third symbol S3, the data of the fourth mat MAT4 may correspond to a fourth symbol S4, the data of the fifth mat MAT5 may correspond to a fifth symbol S5, the data of the sixth mat MAT6 may correspond to a sixth symbol S6, the data of the seventh mat MAT7 may correspond to a seventh symbol S7, the data of the eighth mat MAT8 may correspond to an eighth symbol S8, the data of the ninth mat MAT9 may correspond to a first even parity $P_{0a}$, the data of the tenth mat MAT10 may correspond to a second parity P1, the data of the eleventh mat MAT11 may correspond to a first odd parity $P_{0b}$, the data of the twelfth mat MAT12 may correspond to a ninth symbol S9, the data of the thirteenth mat MAT13 may correspond to a tenth symbol S10, the data of the fourteenth mat MAT14 may correspond to an eleventh symbol S11, the data of the fifteenth mat MAT15 may correspond to a twelfth symbol S12, the data of the sixteenth mat MAT16 may correspond to a thirteenth symbol S13, the data of the seventeenth mat MAT17 may correspond to a fourteenth symbol S14, and the data of the eighteenth mat MAT18 may correspond to a fifteenth symbol S15.

Figure 13:
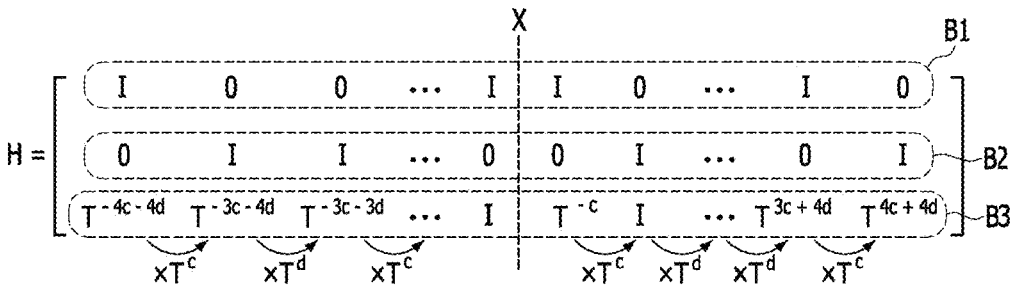
FIG. 13 illustrates an H-matrix which may be applied to the memory device disclosed in FIG. 12.

FIG. 13 illustrates an H-matrix which may be applied to the memory device 20 disclosed in FIG. 12.

As illustrated in FIG. 13, the rows of the H-matrix may correspond to first to third blocks B1 to B3, respectively. The first block B1 corresponding to the first row of the H-matrix may include unit matrices I corresponding to odd-numbered symbols, respectively, and zero matrices 0 corresponding to even-numbered symbols, respectively. The second block B2 corresponding to the second row of the H-matrix may include zero matrices 0 corresponding to odd-numbered symbols, respectively, and unit matrices I corresponding to even-numbered symbols, respectively. The third block B3 corresponding to the third row of the H-matrix may include sub-matrices each having each of elements consisting of $T^{-4c-4d}$, $T^{-3c-4d}$, $T^{-3c-3d}$, . . . , I, $T^{-c}$, I, . . . , $T^{3c+3d}$, $T^{3c+4d}$, and $T^{4c+4d}$ as a representative element. Each of the sub-matrices including each of the elements consisting of $T^{-4c-4d}$, $T^{-3c-4d}$, $T^{-3c-3d}$, . . . , $T^{-d}$, $T^d$ . . . , $T^{3c+4d}$, $T^{3c+4d}$, and $T^{4c+4d}$, among the sub-matrices included in the third block B3, as the representative element may correspond to symbols.

The sub-matrices included in the third block B3 may be disposed in a symmetrical form on the basis of a central axis X. Each of the first to ninth mats MAT1 to MAT9 illustrated in FIG. 12 may correspond to the elements included on the left side on the basis of the central axis X of the third block B3. For example, the first mat MAT1 may correspond to $T^{-4c-4d}$ of the third block B3 and the second mat MAT2 may correspond to $T^{-3c-4d}$ of the third block B3, but this is merely an embodiment and the present disclosure is not limited thereto. Each of the tenth to eighteenth mats MAT10 to MAT18 illustrated in FIG. 12 may correspond to the elements included on the right side on the basis of the central axis X of the third block B3. For example, the eighteenth mat MAT18 may correspond to $T^{4c+4d}$ of the third block B3 and the seventeenth mat MAT17 may correspond to $T^{3c+4d}$ of the third block B3, but this is merely an embodiment and the present disclosure is not limited thereto.

In the H-matrix illustrated in FIG. 13, an error may be corrected when the error occurs in symbols corresponding to sub-matrices, each one having each of elements having a specific distance difference on the basis of the central axis X as a representative element. For example, when an error is included in data that have been stored in a mat corresponding to a symbol of an odd-numbered sub-matrix in the left area of the central axis X, an error is included in data that have been stored in a mat corresponding to a symbol of an even-numbered sub-matrix in the left area of the central axis X, and the representative element of the odd-numbered sub-matrix including the error and the representative element of the even-numbered sub-matrix including the error are set to have a distance difference of $T^c$, the errors stored in the mats may be corrected based on the equations illustrated in FIG. 3.

As another example, when an error is included in data that have been stored in a mat corresponding to a symbol of an odd-numbered sub-matrix in the right area of the central axis X, an error is included in data that have been stored in a mat corresponding to a symbol of an even-numbered sub-matrix in the right area of the central axis X, and the representative element of the odd-numbered sub-matrix including the error and the representative element of the even-numbered sub-matrix including the error are set to have a distance difference of $T^c$, the errors stored in the mats may be corrected based on the equations illustrated in FIG. 3.

As another example, when an error is included in data that have been stored in a mat corresponding to a symbol of an even-numbered sub-matrix in the left area of the central axis X, an error is included in data that have been stored in a mat corresponding to a symbol of an odd-numbered sub-matrix in the left area of the central axis X, and the representative element the even-numbered sub-matrix including the error and the representative element of the odd-numbered sub-matrix including the error are set to have a distance difference of $T^d$, the errors stored in the mats may be corrected based on the equations illustrated in FIG. 4.

As another example, when an error is included in data that have been stored in a mat corresponding to a symbol of an even-numbered sub-matrix in the right area of the central axis X, an error is included in data that have been stored in a mat corresponding to a symbol of an odd-numbered sub-matrix in the right area of the central axis X, and the representative element of the even-numbered sub-matrix including the error and the representative element of the odd-numbered sub-matrix including the error are set to have a distance difference of $T^d$, the errors stored in the mats may be corrected based on the equations illustrated in FIG. 4.

The embodiments of the present disclosure have been described so far. A person having ordinary knowledge in the art to which the present invention pertains will understand that the present invention may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims not the aforementioned description, and all differences within an equivalent range thereof should be construed as being included in the present disclosure.

What is claimed is:

1. An error correction circuit comprising:

a syndrome generation circuit configured to generate a first odd syndrome, a first even syndrome, and a second syndrome based on data;

a location information generation circuit configured to generate odd symbol location information and even symbol location information, based on the first odd syndrome, the first even syndrome, and the second syndrome; and a correction data generation circuit configured to check and correct an error that is included in a first odd-numbered symbol included in the data and an error that is included in a first even-numbered symbol included in the data, based on the first odd syndrome, the first even syndrome, the odd symbol location information, and the even symbol location information, wherein the first even-numbered symbol is consecutive to the first odd-numbered symbol.

2. The error correction circuit of claim 1, wherein the syndrome generation circuit is configured to generate the first odd syndrome indicative of a location of the data in which the error has occurred within the first odd-numbered symbol when the error occurs in the first odd-numbered symbol.

3. The error correction circuit of claim 1, wherein the syndrome generation circuit is configured to generate the first even syndrome indicative of a location of the data in which the error has occurred within the first even-numbered symbol when the error occurs in the first even-numbered symbol.

4. The error correction circuit of claim 1, wherein the syndrome generation circuit is configured to generate the second syndrome indicative of a location of a symbol within which the error has occurred.

5. The error correction circuit of claim 1, wherein:

the correction data generation circuit is configured to check and correct an error included in a second even-numbered symbol included in the data and an error included in a second odd-numbered symbol included in the data, based on the first odd syndrome, the first even syndrome, the odd symbol location information, and the even symbol location information, and the second odd-numbered symbol is consecutive to the second even-numbered symbol.

6. The error correction circuit of claim 1, wherein the syndrome generation circuit is configured to generate the first odd syndrome, the first even syndrome, and the second syndrome by using an error correction code that is implemented as an H-matrix.

7. The error correction circuit of claim 6, wherein:

first, second, and third rows of the H-matrix correspond to first, second, and third blocks, respectively, the first block comprises unit matrices corresponding to odd-numbered symbols, respectively, and zero matrices corresponding to even-numbered symbols, respectively, the second block comprises zero matrices corresponding to the odd-numbered symbols, respectively, and unit matrices corresponding to the even-numbered symbols, respectively, and the third block comprises sub-matrices each comprising each of odd-numbered elements corresponding to the odd-numbered symbols, respectively, as a representative element and sub-matrices each comprising each of even-numbered elements corresponding to the even-numbered symbols, respectively, as a representative element.

8. The error correction circuit of claim 7, wherein:

the even-numbered element has a first distance difference from a previous odd-numbered element, and each of odd-numbered elements subsequent to a third odd-numbered element has a second distance difference from a previous even-numbered element.

9. The error correction circuit of claim 1, wherein the location information generation circuit comprises:

a first location information generation circuit configured to generate the odd symbol location information set as $$\frac{S_1}{S_{0a} + T^c S_{0b}};$$

and a second location information generation circuit configured to generate the even symbol location information set as $$\frac{S_1}{T^d S_{0a} + S_{0b}},$$

wherein the first odd syndrome is indicated by $S_{0a}$, the first even syndrome is indicated by $S_{0b}$, and the second syndrome is indicated by $S_1$.

10. The error correction circuit of claim 9, wherein the first location information generation circuit comprises:

a first multiplier configured to output an output signal by multiplying the first even syndrome by an element having an index form of first exponentiation;

an adder configured to output an output signal by adding the first odd syndrome and the output signal of the first multiplier; and a second multiplier configured to output an output signal by multiplying the output signal of the adder by a representative element of a sub-matrix; and a comparator configured to generate the odd symbol location information by comparing the output signal of the second multiplier and the second syndrome.

11. The error correction circuit of claim 9, wherein second location information generation circuit comprises:

a first multiplier configured to output an output signal by multiplying the first odd syndrome by an element having an index form of second exponentiation;

an adder configured to output an output signal by adding the first even syndrome and the output signal of the first multiplier;

a second multiplier configured to output an output signal by multiplying the output signal of the adder by a representative element of a sub-matrix; and a comparator configured to generate the even symbol location information by comparing the output signal of the second multiplier and the second syndrome.

12. An error correction circuit comprising:

a syndrome generation circuit configured to generate a first odd syndrome, a first even syndrome, and a second syndrome by using an error correction code that is implemented as an H-matrix;

a location information generation circuit configured to generate odd symbol location information and even symbol location information, based on the first odd syndrome, the first even syndrome, and the second syndrome; and a correction data generation circuit configured to generate correction data by correcting an error included in data, based on the first odd syndrome, the first even syndrome, the odd symbol location information, and the even symbol location information, wherein the correction data generation circuit is configured to correct, when it is determined that an error has occurred in a first odd-numbered symbol based on the first odd syndrome and an error has occurred in a first even-numbered symbol that is consecutive to the first odd-numbered symbol based on the first even syndrome, the error included in data of the first odd-numbered symbol and the error included in data of the first even-numbered symbol based on the first odd syndrome, the first even syndrome, and the odd symbol location information.

13. The error correction circuit of claim 12, wherein the correction data generation circuit is configured to correct, when it is determined that an error has occurred in a second even-numbered symbol based on the first even syndrome and an error has occurred in a second odd-numbered symbol consecutive to the second even-numbered symbol based on the first odd syndrome, the error included in data of the second even-numbered symbol and the error included in data of the second odd-numbered symbol based on the first odd syndrome, the first even syndrome, and the even symbol location information.

14. The error correction circuit of claim 13, wherein the correction data generation circuit is configured to correct, when it is determined that an error has occurred in a third odd-numbered symbol based on the first odd syndrome, the error included in data of the third odd-numbered symbol based on the first odd syndrome and the odd symbol location information.

15. The error correction circuit of claim 14, wherein the correction data generation circuit is configured to correct, when it is determined that an error has occurred in a third even-numbered symbol based on the first even syndrome, the error included in data of the third even-numbered symbol based on the first even syndrome and the even symbol location information.

16. The error correction circuit of claim 12, wherein the correction data generation circuit is configured to:

discard the odd symbol location information when a symbol that is indicated by the odd symbol location information is an even-numbered symbol, and discard the even symbol location information when a symbol that is indicated by the even symbol location information is an odd-numbered symbol.

17. An error correction circuit comprising:

a syndrome generation circuit configured to generate a first odd syndrome, a first even syndrome, and a second syndrome by using an error correction code that is implemented as an H-matrix;

a location information generation circuit configured to generate odd symbol location information and even symbol location information, based on the first odd syndrome, the first even syndrome, and the second syndrome; and a correction data generation circuit configured to generate correction data by correcting an error included in data based on the first odd syndrome, the first even syndrome, the odd symbol location information, and the even symbol location information, wherein first, second, and third rows of the H-matrix correspond to first, second, and third blocks, respectively, the first block comprises unit matrices corresponding to odd-numbered symbols, respectively, and zero matrices corresponding to even-numbered symbols, respectively, the second block comprises zero matrices corresponding to the odd-numbered symbols, respectively, and unit matrices corresponding to the even-numbered symbols, respectively, and the third block comprises sub-matrices each comprising each of odd-numbered elements corresponding to the odd-numbered symbols, respectively, as a representative element and sub-matrices each comprising each of even-numbered elements corresponding to the even-numbered symbols, respectively, as a representative element.

18. The error correction circuit of claim 17, wherein:

the even-numbered element has a first distance difference from a previous odd-numbered element, and each of odd-numbered elements subsequent to a third odd-numbered element has a second distance difference from a previous even-numbered element.

19. The error correction circuit of claim 17, wherein:

when the first odd syndrome is indicated by $S_{0a}$, the first even syndrome is indicated by $S_{0b}$, and the second syndrome is indicated by $S_1$, the location information generation circuit comprises:

a first location information generation circuit configured to generate the odd symbol location information set as $$\frac{S_1}{S_{0a} + T^c S_{0b}};$$

and a second location information generation circuit configured to generate the even symbol location information set as $$\frac{S_1}{T^d S_{0a} + S_{0b}}.$$

20. The error correction circuit of claim 19, wherein the first location information generation circuit comprises:

a first multiplier configured to output an output signal by multiplying the first even syndrome by an element having an index form of first exponentiation;

an adder configured to output an output signal by adding the first odd syndrome and the output signal of the first multiplier; and a second multiplier configured to output an output signal by multiplying the output signal of the adder by a representative element of a sub-matrix; and a comparator configured to generate the odd symbol location information by comparing the output signal of the second multiplier and the second syndrome.

21. The error correction circuit of claim 19, wherein the second location information generation circuit comprises:

a first multiplier configured to output an output signal by multiplying the first odd syndrome by an element having an index form of second exponentiation;

an adder configured to output an output signal by adding the first even syndrome and the output signal of the first multiplier;

a second multiplier configured to output an output signal by multiplying the output signal of the adder by a representative element of a sub-matrix; and a comparator configured to generate the even symbol location information by comparing the output signal of the second multiplier and the second syndrome.

22. An error correction circuit comprising:

a syndrome generation circuit configured to generate a first odd syndrome, a first even syndrome, and a second syndrome based on data;

a location information generation circuit configured to generate odd symbol location information and even symbol location information, based on the first odd syndrome, the first even syndrome, and the second syndrome; and a correction data generation circuit configured to correct an error when the error occurs in symbols corresponding to sub-matrices each comprising each of elements having a specific distance difference as a representative element on a left side in relation to a central axis in an H-matrix based on the first odd syndrome, the first even syndrome, the odd symbol location information, and the even symbol location information and configured to correct an error when the error occurs in symbols corresponding to sub-matrices each comprising each of elements having a specific distance difference as a representative element on a right side in relation to the central axis, wherein the sub-matrices included in the H-matrix correspond to the symbols, respectively.

23. The error correction circuit of claim 22, wherein:

first, second, and third rows of the H-matrix correspond to first, second, and third blocks, respectively, the first block comprises unit matrices corresponding to odd-numbered symbols, respectively, and zero matrices corresponding to even-numbered symbols, respectively, the second block comprises zero matrices corresponding to the odd-numbered symbols, respectively, and unit matrices corresponding to the even-numbered symbols, respectively, and the third block comprises sub-matrices each comprising each of odd-numbered elements corresponding to the odd-numbered symbols, respectively, as a representative element and sub-matrices each comprising each of even-numbered elements corresponding to the even-numbered symbols, respectively, as a representative element.

24. The error correction circuit of claim 22, wherein the correction data generation circuit is configured to correct, when a first error is included in data that have been stored in a first mat corresponding to a symbol of an odd-numbered sub-matrix in a left area of the central axis, a second error is included in data that have been stored in a second mat corresponding to a symbol of an even-numbered sub-matrix in the left area of the central axis, and a representative element of the odd-numbered sub-matrix comprising the first error and a representative element of the even-numbered sub-matrix comprising the second error are set to have a first distance difference, the first error of the first mat and the second error of the second mat.

25. The error correction circuit of claim 22, wherein the correction data generation circuit is configured to correct, when a first error is included in data that have been stored in a first mat corresponding to a symbol of an odd-numbered sub-matrix in a right area of the central axis, a second error is included in data that have been stored in a second mat corresponding to a symbol of an even-numbered sub-matrix in the right area of the central axis, and a representative element of the odd-numbered sub-matrix comprising the first error and a representative element of the even-numbered sub-matrix comprising the second error are set to have a first distance difference, the first error of the first mat and the second error of the second mat.

26. The error correction circuit of claim 22, wherein the correction data generation circuit is configured to correct, when a first error is included in data that have been stored in a third mat corresponding to a symbol of an even-numbered sub-matrix in a left area of the central axis, a second error is included in data that have been stored in a fourth mat corresponding to a symbol of an odd-numbered sub-matrix in the left area of the central axis, and a representative element of the even-numbered sub-matrix comprising the first error and a representative element of the odd-numbered sub-matrix comprising the second error are set to have a second distance difference, the first error of the third mat and the second error of the fourth mat.

27. The error correction circuit of claim 22, wherein the correction data generation circuit is configured to correct, when a first error is included in data that have been stored in a third mat corresponding to a symbol of an even-numbered sub-matrix in a right area of the central axis, a second error is included in data that have been stored in a fourth mat corresponding to a symbol of an odd-numbered sub-matrix in the right area of the central axis, and a representative element of the even-numbered sub-matrix comprising the first error and a representative element of the odd-numbered sub-matrix comprising the second error are set to have a second distance difference, the first error of the third mat and the second error of the fourth mat.

* * * * *